United States Patent
Kubota et al.

(10) Patent No.: US 7,476,811 B2
(45) Date of Patent: Jan. 13, 2009

(54) SEMICONDUCTOR DEVICE AND MANUFACTURING METHOD THEREFOR

(75) Inventors: Yoshihiro Kubota, Kawasaki (JP); Kazuto Tsuji, Kawasaki (JP); Sumikazu Hosoyamada, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 225 days.

(21) Appl. No.: 11/078,326

(22) Filed: Mar. 14, 2005

(65) Prior Publication Data
US 2006/0137902 A1 Jun. 29, 2006

(30) Foreign Application Priority Data
Dec. 27, 2004 (JP) ............................. 2004-377039

(51) Int. Cl.
*H05K 1/00* (2006.01)
(52) U.S. Cl. ....................................... 174/250; 361/760
(58) Field of Classification Search ................. 174/260, 174/259, 250; 361/760, 770, 767, 768, 783; 257/667, 737, 738, 778, 787, 789; 438/119, 438/127
See application file for complete search history.

(56) References Cited

U.S. PATENT DOCUMENTS

| | | | | |
|---|---|---|---|---|
| 6,011,304 A | * | 1/2000 | Mertol | 257/706 |
| 6,014,317 A | * | 1/2000 | Sylvester | 361/760 |
| 2001/0001070 A1 | * | 5/2001 | Hsu et al. | 438/126 |
| 2004/0155338 A1 | * | 8/2004 | Shim et al. | 257/738 |
| 2005/0029672 A1 | * | 2/2005 | Hsu et al. | 257/778 |
| 2005/0074923 A1 | * | 4/2005 | Goudarzi | 438/119 |

FOREIGN PATENT DOCUMENTS

| | | |
|---|---|---|
| JP | 8-250529 | 9/1996 |
| JP | 08-250529 | * 9/1996 |
| JP | 2000-58702 | 2/2000 |

* cited by examiner

*Primary Examiner*—Jeremy C Norris
*Assistant Examiner*—Yuriy Semenenko
(74) *Attorney, Agent, or Firm*—Westerman, Hattori, Daniels & Adrian, LLP.

(57) ABSTRACT

A semiconductor device includes: a semiconductor element; a circuit substrate having a cavity at a center thereof; a heat radiating member having the semiconductor element bonded at a central portion thereof; and a sealing resin configured to seal the semiconductor element in the cavity. A configuration is provided such that a bonding resin may be disposed in a gap portion which communicates with the cavity between the circuit substrate and the heat radiating member, and by means of a bonding force of the bonding resin, the heat radiating member is permanently fixed to the circuit substrate.

7 Claims, 6 Drawing Sheets

SEMICONDUCTOR DEVICE AND MANUFACTURING METHOD THEREFOR

BACKGROUND OF THE INVENTION

1. Field of the Invention

The present invention relates to a semiconductor device and a manufacturing method therefor, and, in particular, to a semiconductor device in which a heat radiating member is provided for a substrate having a semiconductor element mounted thereon, and a manufacturing method therefor.

2. Description of the Related Art

Recently, along with an increase of an integration density of a semiconductor element, a heat amount generated from the semiconductor element increases. On the other hand, along with the increase of the integration density of the semiconductor element, an improvement of electrical characteristics of a circuit subsurface on which the semiconductor element is mounted is demanded. In order to satisfy these requirements, a semiconductor device is provided having a configuration in which, a heat radiating plate is disposed on a multilayer substrate, called EBGA (enhanced ball grid array), is provided (for example, see Japanese Laid-open Patent Applications Nos. 08-250529 and 2000-058702).

Figure 1:
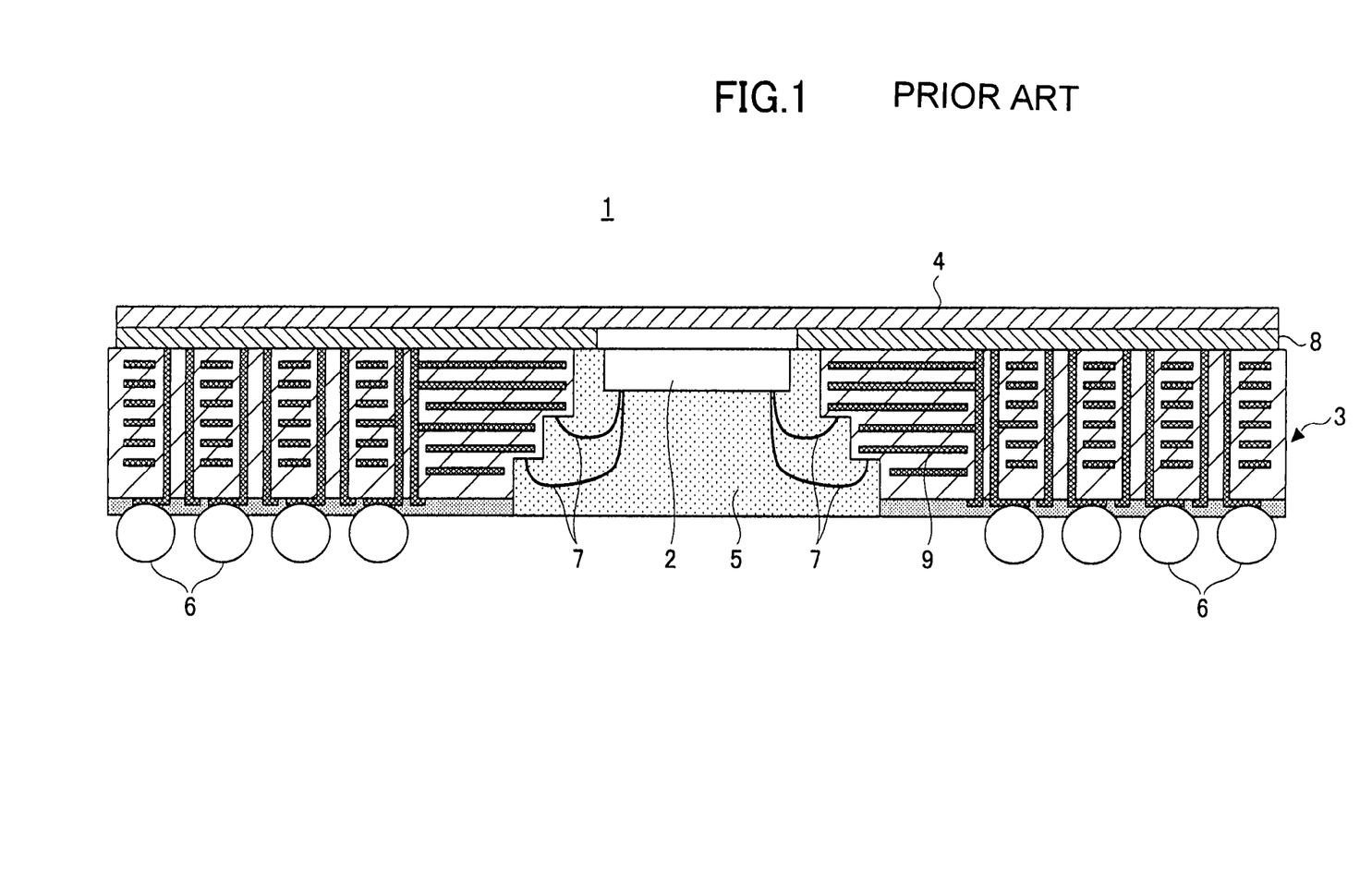
FIG. 1 shows an elevational sectional view of a semiconductor device according to one example of the related art.

FIG. 1 shows an EBGA-type semiconductor device 1 as one example of the related art. This semiconductor device 1 generally includes a semiconductor element 2, a circuit substrate 3, a heat radiating plate 4, a sealing resin 5 and solder balls 6.

The circuit substrate 3 is a multilayer interconnection substrate, and includes a plurality of layers of interlayer interconnections 9. This circuit substrate 3 has a stair-step-shaped cavity provided at a center thereof. The heat radiating plate 4 is made of a metal material having good thermal conductivity. This heat radiating plate 4 is fixed to the circuit substrate 3 with the use of an adhesive sheet 8.

In the semiconductor device 1 shown in FIG. 1, the heat radiating plate 4 is mounted on the semiconductor element 2. Thereby, a heat generated from the semiconductor element 2 is radiated externally directly through the heat radiating plate 4. Thus, it is possible to increase the heat radiation efficiency. Further, wires 7 are applied to electrically connect between the semiconductor element 2 and the circuit substrate 3.

The sealing resin 5 is applied to fill the cavity in which the semiconductor element 2 is disposed. Thereby, the semiconductor element 2 and the wires 7 are sealed by the sealing resin 5. As a result, the semiconductor element 2 and the wires are protected. The solder balls 6 are disposed on a side of the circuit substrate 3 opposite to a side on which the heat radiating plate 4 is disposed.

In the semiconductor device in the related art described above with reference to FIG. 1, the adhesive sheet 8 made of a heat curing resin or a thermoplastic resin is applied to fix the heat radiating plate 4 to the circuit substrate 3. Specifically, the adhesive sheet 8 is placed on the circuit substrate 3, and also, on the adhesive sheet 8, the heat radiating plate 4 is disposed, first. Then, a thus-obtained intermediate product is heated during seconds at 200° C. Thereby, the heat radiating plate 4 is temporarily fixed to the circuit substrate 3. In this state, the adhesive sheet 8 is not yet hardened completely, and thus, the heat radiating plate 4 is merely temporarily fixed to the circuit substrate 3.

After the completion of the temporary fixing, permanent fixing processing is carried out in which the circuit substrate on which the heat radiating plate 4 is temporarily fixed is heated at a temperature on the order of 150° C. during hours, for example. A reason why such a long duration is required for the permanent fixing processing is that generation of voids in the adhesive sheet 8 otherwise occurring when rapid heating processing is carried out should be avoided. Also, an unnecessary stress should be prevented from being generated in the adhesive sheet 8. In order to positively avoid the generation of voids, the above-mentioned permanent fixing processing may be carried out in vacuo.

Thus, in the semiconductor device 1 according to the related art, the adhesive sheet 8 is required to fix the heat radiating plate 4 and the sealing resin 5, and also, the two times of heating processing should be carried out for fixing the heat radiating plate 4 and the sealing resin 5 with the use of the adhesive sheet 8. Further, in this permanent fixing processing, it is necessary to keep the heating condition on the order of 150° C. for hours. Thus, the efficiency of the fixing process for fixing the radiating plate 4 to the circuit substrate 3 is degraded. Thus, the semiconductor device 1 in the related art requires the many components/parts, and also, the manufacturing efficiency thereof is not high. As a result, the semiconductor device 1 becomes expensive.

SUMMARY OF THE INVENTION

The present invention has been devised in consideration of these problems, and an object of the present invention is to provide a semiconductor device and a manufacturing method therefor, by which the number of required components/parts can be reduced, and also, the manufacturing process can be simplified.

In order to achieve the objects, the present invention according to a first aspect includes: a semiconductor element; a circuit substrate having a cavity at a center thereof; a heat radiating member having the semiconductor element bonded at a central portion thereof; and a sealing resin configured to seal the semiconductor element in the cavity, wherein: a configuration is provided such that a bonding resin may be disposed in a gap portion which communicates with the cavity between the circuit substrate and the heat radiating member, and by means of adhesive power of the bonding resin, the heat radiating member is permanently fixed to the circuit substrate.

In this configuration, the bonding resin is inserted in the gap portion communicating with the cavity between the circuit substrate and the heat radiating plate, and, by means of the adhesive power thereof, the heat radiating plate and the circuit substrate are permanently fixed to one another. Accordingly, no adhesive, other than the sealing resin, is required for fixing the heat radiating member to the circuit substrate, and also, no extra bonding process therefor is required. Thus, it is possible to reduce the number of the required components/parts, and thus, it is possible to reduce the cost.

According to a second aspect of the present invention, in the semiconductor device according to the first aspect of the present invention, an insulating material may be disposed on a surface of the circuit substrate, which surface faces the heat radiating member, and also, a dam part may be produced on the insulating material at a peripheral portion of the gap portion for avoiding a flow of the bonding resin.

According to a third aspect of the present invention, in the semiconductor device according to the first aspect of the present invention, a dam part may be produced on the heat radiating member at a peripheral portion of the gap portion for avoiding a flow of the bonding resin.

In the configuration of the second aspect or the third aspect of the present invention, the dam part may be provided to avoid a flow of the bonding resin Thereby, it is possible to prevent the bonding resin from flowing out from the circuit substrate. Accordingly, it is possible to improve the reliability, even when a configuration is applied in which the heat radiating member is directly fixed to the circuit substrate by means of the bonding resin.

According to a fourth aspect of the present invention, in the semiconductor device according to the any one of the first through the third aspects of the present invention, a temporary fixing part may be provided for temporarily fixing the heat radiating member to the circuit substrate.

In this configuration, as a result of providing the temporary fixing part for temporarily fixing the heat radiating member to the circuit substrate, it is possible to prevent the heat radiating member from being change in position or removed from the circuit substrate when the bonding resin is inserted, and thus, it is possible to positively insert the bonding resin in the gap portion.

According to a fifth aspect of the present invention, in the semiconductor device according to the fourth aspect of the present invention, a recess portion may be produced at a position at which the temporary fixing part is provided.

In this configuration, it is possible to determine a laser soldering position from the recess portion, and also, it is possible to improve working efficiency of applied laser light in comparison to a case where a flat surface is worked with laser light.

According to a sixth aspect of the present invention, in the semiconductor device according to the first aspect of the present invention, the circuit substrate may have a dummy substrate part in a periphery thereof; and a temporary fixing part is provided with which the heat reradiating member is temporarily fixed to the dummy substrate part.

In this configuration, as a result of the temporary fixing part being provided to the dummy substrate part provided in the circuit substrate, and also, the heat radiating member being temporarily fixed to this temporary fixing part, it is possible to improve a design freedom of the circuit substrate and also it is possible to increase the integration density, as a result of removing the dummy substrate part after the heat radiating member is permanently fixed to the circuit substrate by means of the bonding resin.

According to a seventh aspect of the present invention, in the semiconductor device according to the sixth aspect of the present invention, a recess portion may be produced in the heat radiating member at a position at which the temporary fixing part is provided.

In this configuration, it is possible to determine a laser soldering position from the recess portion, and also, it is possible to improve working efficiency of applied laser light in comparison to a case where a flat surface is worked with laser light.

According to an eighth aspect of the present invention, in a semiconductor device manufacturing method for manufacturing a semiconductor device comprising a semiconductor element, a circuit substrate having a cavity produced at a center thereof, a heat radiating member and a sealing resin sealing the semiconductor element, in a temporary fixing step of temporarily fixing the heat radiating member to the circuit substrate, a gap portion is produced between the heat radiating member and the circuit substrate; in an element mounting step, the semiconductor element is disposed inside of the cavity produced in the circuit substrate to which the radiating member is temporary fixed; and in a sealing resin inserting step, the sealing resin is inserted in the gap portion and the cavity by a potting process, and thereby, the semiconductor element is sealed and also the heat radiating member is permanently fixed to the circuit substrate.

In this configuration, after the heat radiating member is temporarily fixed to the circuit substrate in such a manner that the gap portion is produced between the heat radiating member and the circuit substrate in the temporary fixing step, the sealing resin is inserted in the gap portion in the sealing resin inserting step, and, with the use of the sealing resin, the heat radiating member is permanently fixed to the circuit substrate. As a result, it is possible to omit a bounding step which would be otherwise required in the related art to fix the heat radiating member to the circuit substrate as a separate step in addition to the step of inserting the sealing resin in the cavity. Accordingly, it is possible to simplify the manufacturing process and to reduce the cost.

According to a ninth aspect of the present invention, in the semiconductor manufacturing method according to the eight aspect of the present invention, the temporary fixing step may include a step of temporarily fixing the heat reradiating member to a metal layer provided on the circuit substrate by a laser soldering process.

In this configuration, it is possible to easily and positively carry out the temporary fixing processing.

According to a tenth aspect of the present invention, in a semiconductor device manufacturing method for manufacturing a semiconductor device comprising a semiconductor element, a circuit substrate having a cavity produced at a center thereof, a heat radiating member and a sealing resin sealing the semiconductor element, in a temporary fixing step, the heat radiating member is temporarily fixed to a dummy substrate part provided in a periphery of the circuit substrate in such a manner that a gap portion is be produced between the heat radiating member and the circuit substrate; in an element mounting step, the semiconductor element is disposed inside of the cavity produced in the circuit substrate to which the radiating member is temporary fixed; in a sealing resin inserting step, the sealing resin is inserted in the gap portion and the cavity by a potting process, and thereby, the semiconductor element is sealed and also the heat radiating member is permanently fixed to the circuit substrate; and in a removing step, the dummy substrate part is removed.

As described above, according to the present invention, it is possible to omit a bounding step which would be otherwise required in the related art to fix the heat radiating member to the circuit substrate as a separate step in addition to the step of inserting the sealing resin in the cavity. Accordingly, it is possible to reduce the number of the required components/parts, and to reduce the cost.

BRIEF DESCRIPTION OF THE DRAWINGS

Other objects and further features of the present invention will become more apparent from the following detailed description when read in conjunction with the accompanying drawings.

DETAILED DESCRIPTION OF THE PREFERRED EMBODIMENTS

The best mode for carrying out the present invention will now be described with reference to figures.

Figure 2A:
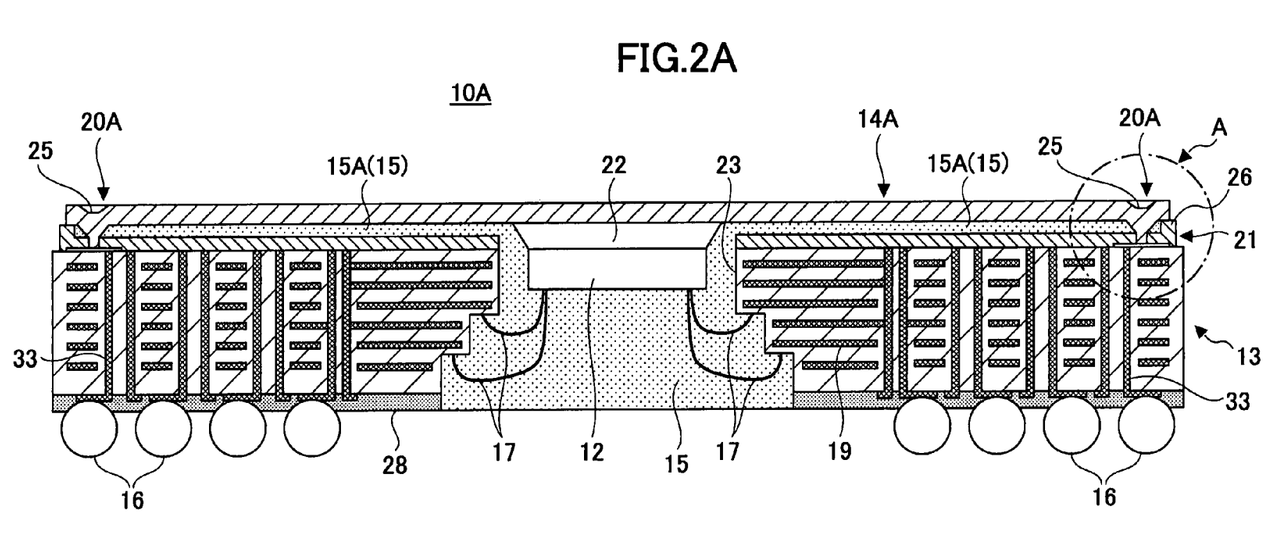
FIGS. 2A and 2B show an elevational sectional view of a semiconductor device according to a first embodiment of the present invention.
Figure 2B:
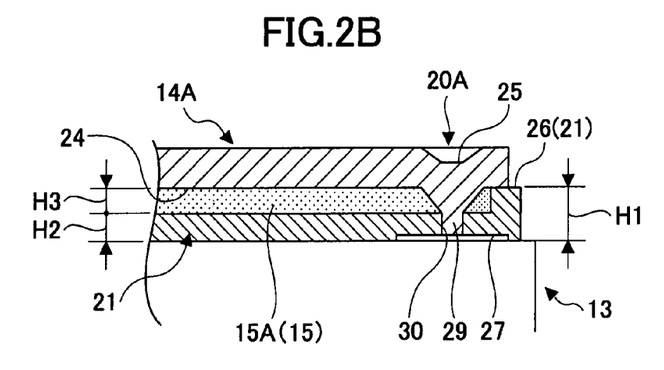

FIGS. 2A and 2B show a semiconductor device 10A according to a first embodiment of the present invention. FIG. 2A shows a longitudinal sectional view of the semiconductor device 10A, while FIG. 2B shows a magnified view of a part encircled by an alternate long and short dash line of FIG. 2A.

The semiconductor device 10A is a semiconductor device in an EBGA type, and, generally, includes a semiconductor element 12, a circuit substrate 13, a heat radiating plate 14A, a sealing resin 15, and solder balls 16.

The circuit substrate 13 is a multilayer printed wiring substrate, and, has a configuration in which, in a resin substrate having insulating properties, a plurality of layers of interlayer interconnections 19 and feedthrough electrodes 33 are produced. Further, an insulating material 21 is produced on a side of the circuit substrate 13 facing the heat radiating plate 14A, and, on the opposite side of the circuit substrate 13, a solder resist 28 is produced. At a central position of the circuit substrate 13, a stair-step-shaped cavity 23 is produced. On the step portions of the cavity 23, bonding pads (not shown) on which wires 17 are bounded, described later, are produced.

The insulating material 21 is made of an insulating resin, and is produced to protect a metal layer produced on the top surface of the circuit substrate 13. This insulating material 21 has a configuration in which, holes 30 (see FIG. 2B) are produced at positions corresponding to temporary fixing parts 20A described later, and also, a first dam part 26 is produced integrally in the periphery. A thickness H1 (shown in FIG. 2B) of this first dam part 26 is larger than a thickness H2 of the insulating material 21 at a position other than the first dam part 26 (H1>H2). As will be described later, the first dam part 26 has a function (a function of a dam) of blocking a flow of a bonding resin 15A when the bonding resin 15A is inserted as will be described later.

The semiconductor element 12 is disposed inside of the cavity 23. The semiconductor element 12 is a highly integrated circuit device. Therefore, the circuit substrate 13 has the many layers of interconnections 19 so as to deal with the highly integrated configuration of the semiconductor element 12. Further, since the circuit substrate 13 itself is thus also highly integrated, a large quantity of heat is generated therefrom when it is driven. Therefore, the heat radiating plate 14A is provided to the semiconductor device 10A.

The heat radiating plate 14A is made of a metal material (for example, copper) having a good thermal conductivity. In this embodiment, a plan shape of the heat radiating plate 14A is determined to be the same as a plan shape of the circuit substrate 13. This heat radiating plate 14A is temporarily fixed to the circuit substrate 13 at the temporary fixing parts 20A. Further, with the use of the bonding resin 15A, the heat radiating plate 14A is permanently fixed to the circuit substrate 13. However, for the sake of simplicity, a configuration in which the heat radiating plate 14A is thus permanently fixed to the circuit substrate 13 is described later.

The semiconductor element 12 is directly mounted on the heat radiating plate 14A with the use of a die attachment material 22. The die attachment material 22 is an adhesive having a good thermal conductivity, and as a result, heat generated from the semiconductor element 12 is directly radiated externally by means of the heat radiating plate 14A through the die attachment material 22. Thus, even when a heat quantity generated by the semiconductor element 12 is large, the heat can be positively radiated, and thus, the reliability of the semiconductor element 12 is improved.

The wires 17 are applied to electrically connect between the semiconductor element 12 and the circuit substrate 13. As mentioned above, the cavity 23 has the plurality of step portions (three steps in the embodiment as shown) so as to form a stair-step shape, and the bonding pads (not shown) are produced on the predetermined step portions. Therefore, even when the number of the wires 17 increases as the semiconductor element 12 is highly integrated as mentioned above, it is possible to deal with such a highly integrated configuration in a high density, as a result of the wires 17 being bonded to the plurality of step portions on which the bonding pads are provided in a distribution manner.

The solder balls 16 are produced on the side of the circuit substrate 13 opposite to the side on which the heat radiating plate 14A is disposed. The solder balls 16 are electrically connected with the semiconductor element 12 through the interlayer interconnections 19, the feedthrough electrodes 33 and the wires 17.

Further, the cavity 23 in which the semiconductor element 12 is disposed is filled with the sealing resin 15. Thereby, the semiconductor element 12 and the wires 17 are protected by the sealing resin 15. As will be described later, the sealing resin 15 is loaded in the cavity 23 by a potting process. Further, the sealing resin 15 not only protects the semiconductor element 12 and the wires 17, but also has a function to permanently fix the heat radiating plate 14A to the circuit substrate 13. Details thereof are described now.

As shown in FIG. 2B, projections 29 projecting toward the circuit substrate 13 are produced on the temporary fixing parts 20A of the heat radiating plate 14A. As will be described later, the projections 29 are soldered onto the metal layer 27 produced on the top side of the circuit substrate 13 by a laser soldering process. Thereby, the heat radiating plate 14A is temporarily fixed to the circuit substrate 13. In the present embodiment, since the laser soldering process is thus applied to temporarily fix the heat radiating plate 14A to the circuit substrate 13, it is possible to achieve the temporary fixing easily and positively.

At this time, since the projections 29 are provided on the heat radiating plate 14A, a gap portion 24 is produced to have a height H3 shown in FIG. 2B between the heat radiating plate 14A and the circuit substrate 13 in the state in which the heat radiating plate 14A is temporarily fixed to the circuit substrate 13. This gap portion 24 is produced throughout the entire position in which the heat radiating plate 14A faces the circuit substrate 13 other than the position at which the first dam part 26 is produced as described later. Further, the gap portion 24 is configured to communicate with the cavity 23 produced in the circuit substrate 13.

In the present embodiment, the bonding resin 15A is inserted in the gap portion 24, and, by means of adhesive power of the bonding resin 15A, the heat radiating plate 15A is permanently fixed to the circuit substrate 13. Further, the gap portion 24 communicates with the cavity 23, and as a result, the bonding resin 15A and the sealing resin 15 inserted in the cavity 23 are integrally configured. In other words, the sealing resin 15 also acts as the bonding resin 15A which are provided in the cavity 23 and also in the gap portion 24, continuously.

Thus, the bonding resin 15A (or the sealing resin 15) is inserted in the gap portion 24 produced between the circuit substrate 13 and the heat radiating plate 14, further than the cavity 23 in which the semiconductor element 12 is disposed. Then, by means the adhesive power thereof, the heat radiating plate 14A is permanently fixed to the circuit substrate 13 as mentioned above. As a result, an adhesive which would be required in the related art, in addition to the sealing resin, to fix the heat radiating plate 14 to the circuit substrate 13, and a relevant bonding process become not required. Accordingly, it is possible to reduce the number of the required components/parts and to reduce the cost.

A manufacturing method for the semiconductor device 10A according to the first embodiment of the present invention configured as described above is described next. FIGS. 3A through 3D show the manufacturing method for the semiconductor device 10A along its manufacturing procedure.

Figure 3A:
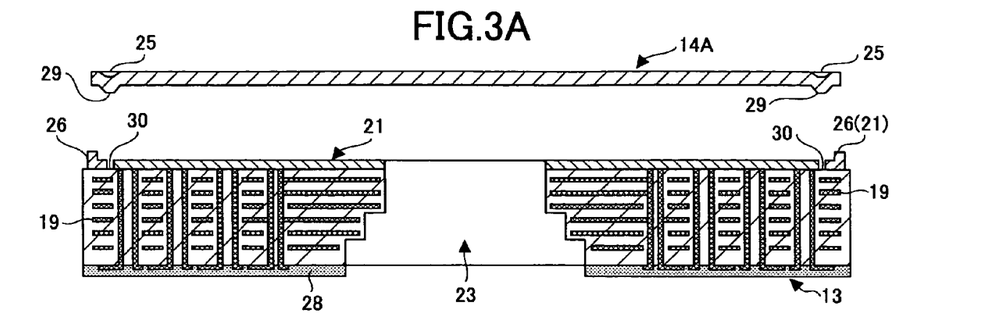
FIGS. 3A through 3D illustrate a manufacturing method for the semiconductor device according to the first embodiment of the present invention.

In order to manufacture the semiconductor device 10A, as shown in FIG. 3A, the circuit substrate 13 and the heat radiating plate 14A are prepared. In the circuit substrate 13, the cavity 23, the first dam part 26, the soldering resist 28, the holes 30 and so forth are previously produced. On the other hand, also in the heat radiating plate 14A, recess portions 25 and the projections 29 are previously produced. Also, the heat radiating plate 14A is previously molded to have a predetermined outline shape corresponding to the outline shape of the circuit substrate 13.

As shown in FIG. 3A, the circuit substrate 13 and the heat radiating plate 14A are positioned in such a manner that the projections 29 produced on the heat radiating plate 14A may face the holes 30 produced in the insulating material 21 of the circuit substrate 13. At this time, since the recess portions 25 are produced on the heat radiating plate 14A at positions of the temporary fixing parts 20A, it is possible to carry out the positioning with the use of the recess portions 25. Since the recess portions 25 are produced on the obverse side of the heat radiating plate 14A (the side opposite to the side facing the circuit substrate 13), the positions of the recess portions 25 can be easily determined. As a result, the positioning between the circuit substrate 13 and the heat radiating plate 14A can be easily achieved with the use of the recess portions 25.

Figure 3B:
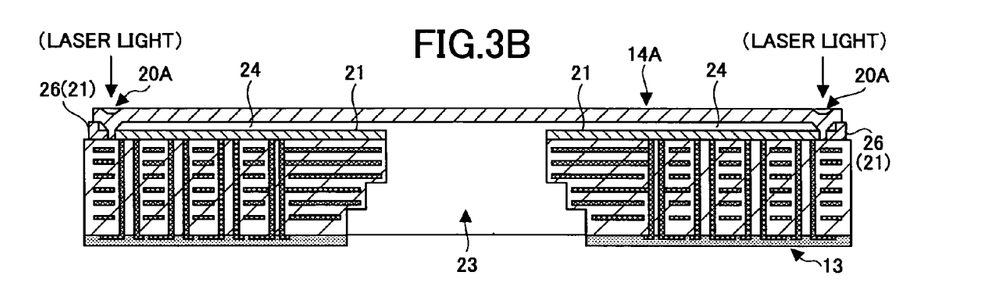

Then, the heat reradiating plate 14A is mounted on the circuit substrate 13 in such a manner that the projections 29 may be inserted in the holes 30. After that, as shown in FIG. 3B, laser light is applied to the recess portions 25 of the temporary fixing parts 20A, and thus, the projections 29 are soldered onto the metal layer 27 by a laser soldering process. Thereby, the heat radiating plate 14A is temporarily fixed to the circuit substrate 13 (temporary fixing process). At the time of the laser soldering, since the recess portions 25 are produced at the temporary fixing parts 20A showing positions at which the laser soldering is carried out, it is possible to reduce a luminous energy of the laser light reflected by the surface in comparison to a case where a position at which laser soldering is carried out has a flat surface. Thus, it is possible to improve the working efficiency.

Further, since the projections 29 are soldered onto the circuit substrate 13 (metal layer 27) in the laser soldering manner, the gap portion 24 (see FIG. 2B) is produced between the circuit substrate 13 and the heat radiating plate 14A. However, the first dam part 26 is produced in the periphery of the insulating material 21, and the first dam part 26 has the height H1 which is larger than the thickness of the other portion. As a result, in the state in which the heat radiating plate 14A is temporarily fixed to the circuit substrate 13, the circuit substrate 13 and the heat radiating plate 14A are in contact with one another tightly at the position at which the first dam part 26 is produced.

After the heat radiating plate 14A is thus temporarily fixed to the circuit substrate 13, an element mounting process of mounting the semiconductor element 12 is then carried out after the circuit substrate 13 is inverted upside down. This inverting process can be easily achieved since the circuit substrate 13 and the heat radiating plate 14A are temporarily fixed. Also, the relative positional relationship between the circuit substrate 13 and the heat radiating plate 14A is kept unchanged even during the inverting process, accordingly.

Figure 3C:
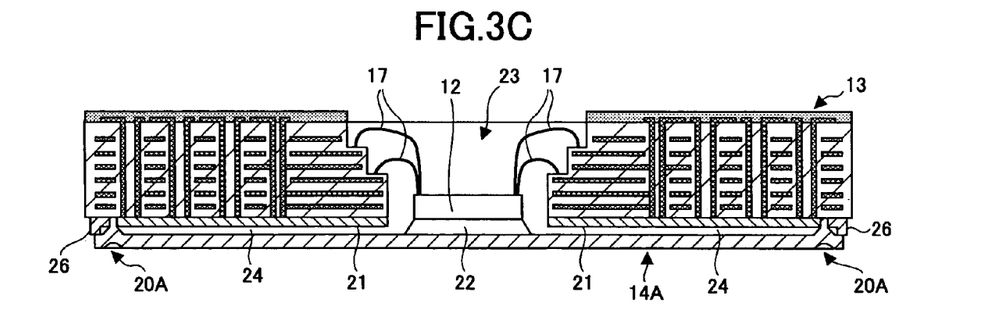

In this element mounting process, first, the semiconductor element 12 is mounted on the heat radiating plate 14A which is exposed in the cavity 23, with the use of the die attachment material 22. Then, the wires 17 are bonded between the semiconductor element 12 thus mounted on the heat radiating plate 14A and the circuit substrate 13. FIG. 3C shows a state in which the wires 17 are thus provided between the semiconductor element 12 and the circuit substrate 13.

Figure 3D:
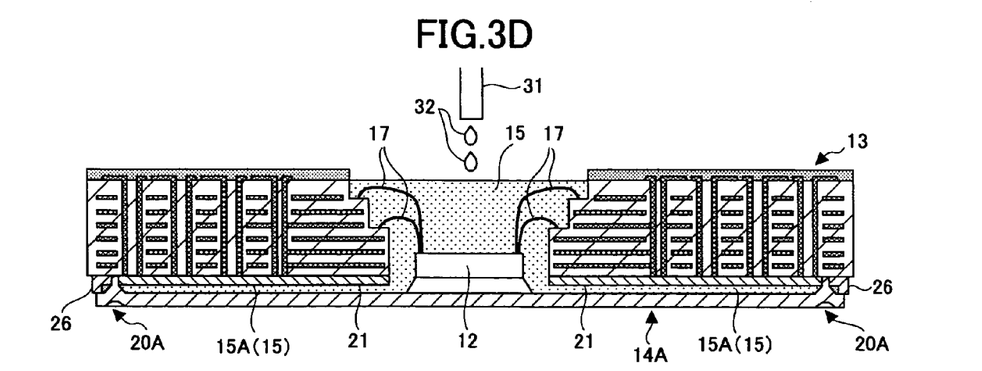

After the element mounting process is thus completed, a sealing resin inserting process is carried out. In this process, as shown in FIG. 3D, potting of a resin 32 is carried out with the use of a dispenser 31, for the cavity 23. At this time, since the gap portion 24 communicates with the cavity 23 as mentioned above, the resin 32 potted in the cavity 23 then runs also into the gap portion 24.

At this time, since the first dam part 26 is provided in the periphery of the insulating material 21, and the circuit substrate 13 and the heat radiating plate 14A are in contact with one another tightly at the first dam part 26 as mentioned above, the flow of the resin 32 is blocked by the first dam part 26. Thereby, the resin 32 is prevented from flowing externally from the circuit substrate 13. Accordingly, it is possible to prevent the outside of the circuit substrate 13 from being contaminated by the resin 32 otherwise having flown externally. Thus, it is possible to improve the reliability of the semiconductor device 10A thus manufactured. Further, a process otherwise required to remove the resin otherwise having flown externally can be omitted. Thus, it is possible to simplify the manufacturing process.

Further, since the heat radiating plate 14A is temporarily fixed to the circuit substrate 13 as mentioned above, the positional relationship of the heat reradiating plate 14A with respect to the circuit substrate can be kept unchanged even during the process where the resin 32 is thus inserted. Thus, it is possible to positively insert the sealing resin in the narrow gap portion 24.

After the completion of the potting of the resin 32, heating processing (for example, 150° C.) is carried out so that the resin 32 is hardened. Thus, the sealing resin 15 and the bonding resin 15A are produced. Further, as a result of the resin 32 being hardened into the bonding resin 15A, the heat radiating plate 14A is permanently fixed to the circuit substrate 13 by means of the adhesive power of the bonding resin 15A.

This heating processing is that which is commonly carried out in a semiconductor manufacturing process applying such a potting process, and as a result of the heating processing being applied, the process can be completed easily within a reduced processing time. Further, the resin 32 is loaded into the gap portion 24 in a liquid state, and also, the gap portion 24 communicates with the resin 32 loaded in the cavity 23 which communicates with the outside. Accordingly, even when a volume change or void generation occurs during the thermally hardening process, the volume change is absorbable in the cavity 23 having the larger volume, and also the voids are discharged to the outside from the top opening of the cavity 23 after moving thereto through the liquid resin 32. Therefore, it is possible to prevent an internal stress from occurring or to prevent voids from remaining in the sealing resin 15 or in the bonding resin 15A. Thus, it is possible to improve the reliability of the semiconductor device 10A.

Further, in the present embodiment, as mentioned above, in the temporary fixing process, the heat radiating plate 14A is temporarily fixed in such a manner that the gap portion 24 may be produced between the circuit substrate 13 and the heat radiating plate 14A. Then, after that, in the sealing resin inserting process, the bonding resin 15A is produced in the gap portion 24, and therewith, the heat radiating plate 14A is permanently fixed to the circuit substrate 13. Therefore, it is possible to omit the adhesive sheet 8 (see FIG. 1) and a process of applying the adhesive sheet 8 to fix between the circuit substrate 3 and the heat radiating plate 4, which would be required in the related art as mentioned above. Thus, it is possible to simplify the manufacture process and to reduce the cost.

Other embodiments of the present invention are described next with reference to FIGS. 4, 5 and 6A through 6D. In these figures, the same reference numerals are given to the same components/parts as those shown in FIGS. 2A, 2B and 3A through 3D applied for describing the semiconductor device 10A according to the first embodiment of the present invention and the manufacturing method therefor, and the duplicated description therefor will be omitted.

Figure 4:
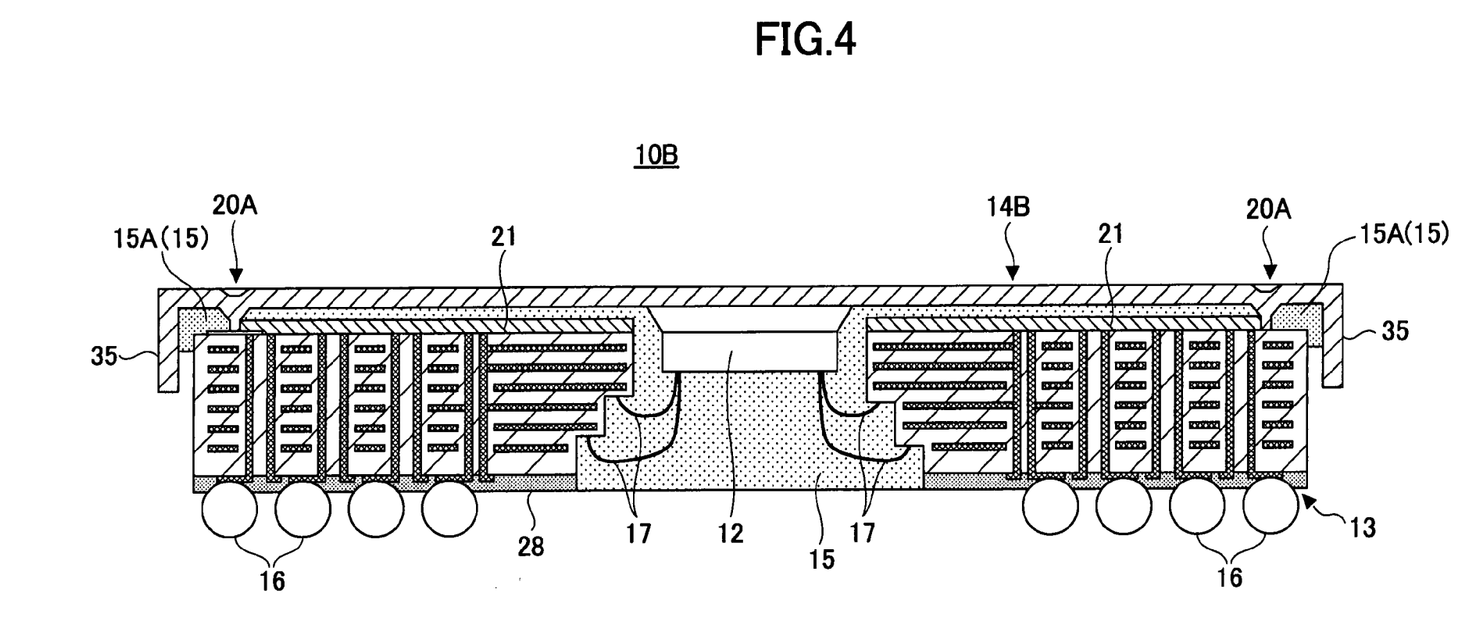
FIG. 4 shows an elevational sectional view of a semiconductor device according to a second embodiment of the present invention.

FIG. 4 shows a semiconductor device 10B in a second embodiment of the present invention. In the semiconductor device 10A in the first embodiment described above, the first dam part 26 is produced in the insulating material 21 for the purpose of preventing the resin 32 from leaking externally from the circuit substrate 13 in the sealing resin inserting process. As a result of providing the first dam part 26, it is possible to prevent unnecessary resin 32 from leaking from the circuit substrate 13, and thus, this configuration is advantageous.

However, since the heat radiating plate 14A is soldered onto the circuit substrate 13 by laser light as mentioned above, the height of the gap portion 24 (the separation between the heat radiating plate 14A and the circuit substrate 13) may change at this time. Therefore, for some case, the dam function of the first dam part 26 may not sufficiently work.

In the semiconductor device 10B according to the second embodiment, a second dam part 35 is produced in a heat radiating plate 14B. The second dam part 35 is integrally produced on the heat radiating plate 14B, and vertically stands from a peripheral portion of the heat radiating plate 14B as shown in FIG. 4 (vertically projects downward in the figure).

The second dam part 35 may be produced integrally in a plastic working manner by a press working process simultaneously when the heat radiating plate 14B is molded. Alternatively, the second dam part 35 may be produced as a result of a plate piece made of the same material or of a different material being bonded in a soldering manner or such onto the peripheral potion of the already molded heat radiating plate 14B. In any manner, an essential matter is that, when the heat radiating plate 14B is placed in such a manner that the second dam part 35 extends upward (as a result of being inverted upside down from the state shown in FIG. 4), the heat radiating plate 14B has a shape of a case with a bottom. When the configuration of this second embodiment is applied, the first dam part 26 should not be produced in the insulating material 21, and thus the insulating material 21 may have a uniform thickness of H2 (FIG. 2B) throughout the entire area thereof.

In the sealing resin inserting process of the semiconductor device 10A in the first embodiment shown in FIG. 3D, a mode is assumed in which the heat radiating plate 14A shown in FIG. 3D is replaced by the heat radiating plate 14B shown in FIG. 4. Under this assumption, the resin 32 dropped from the dispenser 31 flows to the outside of the heat radiating plate 14B through the gap portion 24. Since the first dam part 26 is not provided in the second embodiment, the resin leaks externally from the periphery of the circuit substrate 13. However, in the second embodiment, the second dam part 35 is provided in the peripheral portion of the heat radiating plate 14B. Therewith, the resin 32 does not actually leak externally from the heat radiating plate 14B having the shape of the case with the bottom as mentioned above. Thus, also in the configuration of the semiconductor device 10B in the second embodiment of the present invention, it is possible to improve the reliability the same as in the semiconductor device 10A in the first embodiment.

Figure 5:
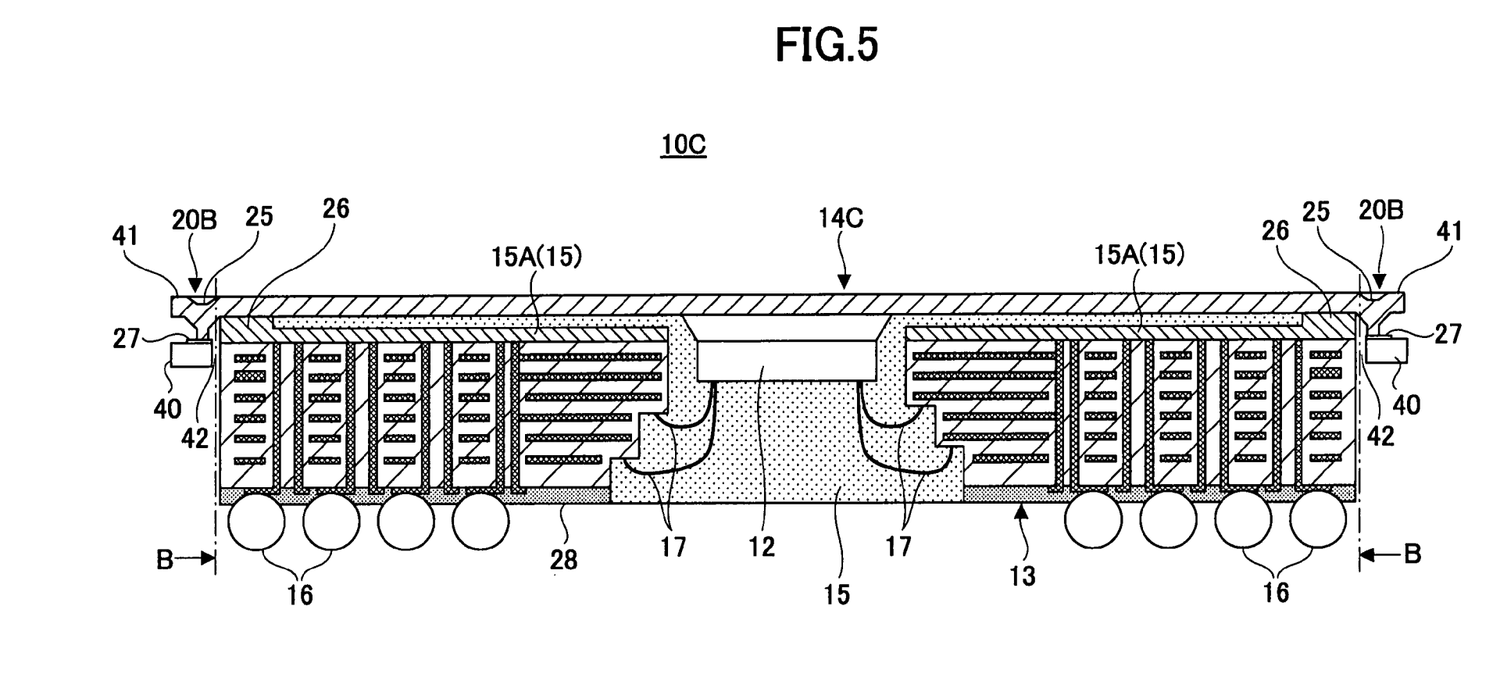
FIG. 5 shows an elevational sectional view of a semiconductor device according to a third embodiment of the present invention.

FIG. 5 shows a semiconductor device 10C according to a third embodiment of the present invention. In the semiconductor device 10A in the first embodiment described above, the temporary fixing parts 20A are produced inside of the circuit substrate 13. In this configuration, interconnections or such cannot be disposed at the positions of the temporary fixing parts 20A even inside of the circuit substrate 13. Thereby, the design freedom of the circuit substrate 13 may be limited. In the semiconductor device 10C in the third embodiment, dummy substrate parts 40 are produced at peripheral portions of the circuit substrate 13. Then, on the dummy substrate parts 40, temporary fixing parts 20B, with which a heat radiating plate 14C is temporarily fixed to the circuit substrate 13 are provided.

The dummy substrate parts 40 are integrally configured with the circuit substrate 13, and thus, are made of resinous circuit substrates. On the top sides of the dummy substrate parts 40, metal layers 27 on which the heat radiating plate 14C is bonded by a laser soldering process are produced. The dummy substrate parts 40 may have a configuration the same as that of the circuit substrate 13, or, may be configured to have a reduced thickness as shown in FIG. 5. This is because, since the dummy substrata parts 40 will be finally removed as described later, these parts are preferably smaller in their volumes in terms of reducing the parts to be finally removed. However, the dummy substrate parts 40 should have a predetermined strength for a time of a laser soldering process or a temporary fixing process described later.

A plurality of slits 42 are provided between the circuit substrate 13 and the dummy substrate parts 40. These slits 42 are provided for the purpose that, when the dummy substrate parts 40 are removed (cut out) from the circuit substrate 13, this removing processing can be achieved easily accordingly.

Along with the provision of the dummy substrate parts 40 to the circuit substrate 13, the heat radiating plate 14C should have a size corresponding to a size of the circuit substrate 13 in a state in which the dummy substrate parts 40 are thus provided thereto. Then, at positions of the heat radiating plate 14C facing the dummy substrate parts 40 (specifically, at positions facing the metal layers 27), recess portions 25 and projections 29 are produced as shown in FIG. 5. Then, as a result of the projections 29 being bonded to the metal layers 27 by a laser soldering process, the heat radiating part 14C is temporarily fixed to the circuit substrate 13 in the same manner as that of the first embodiment.

Thus, in the semiconductor device 10C in the third embodiment, the temporary fixing parts 20B are provided on the dummy substrate parts 40 provided to the circuit substrate 13, and at the temporary fixing parts 20B, the heat radiating plate 14C is temporarily fixed to the circuit substrate 13. By applying this configuration, it is not necessary to provide the temporary fixing parts 20B within the circuit substrate 13 itself. As a result, the design freedom of the circuit substrate 13 can be improved, and also, it is possible to improve the space efficiency. As a result, it is possible to achieve a highly integrated configuration in a high density of interconnections or such.

With reference to FIGS. 6A through 6D, a manufacturing method for the semiconductor device 10C in the third embodiment configured as described above is described next. FIGS. 6A through 6D show the manufacturing method for the semiconductor device 10C along its manufacturing procedure. The same reference numerals as those of the components/parts shown in FIGS. 3A through 3D applied for describing the manufacturing method for the semiconductor device 10A in the first embodiment are given to the same components/parts, and the duplicated description therefor will be omitted.

Figure 6A:
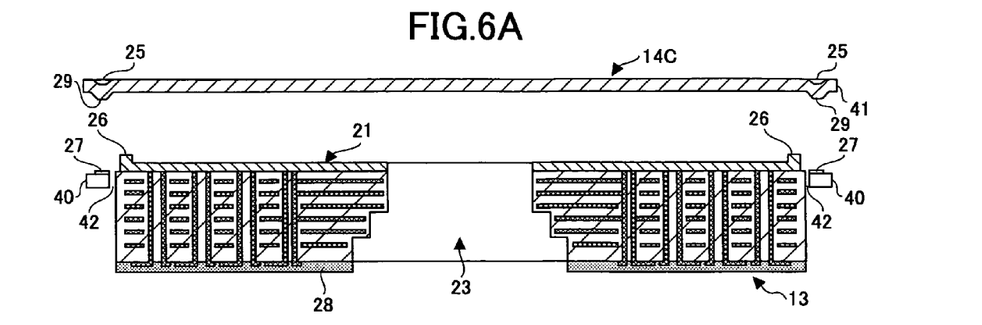
FIGS. 6A through 6D illustrate a manufacturing method for the semiconductor device according to the third embodiment of the present invention.

In order to manufacture the semiconductor device 10C in the third embodiment, as shown in FIG. 6A, the circuit substrate 13 to which the dummy substrate parts 40 are previously provided and the heat radiating plate 14C having the size corresponding to that of the circuit substrate 13 thus having the dummy substrate parts 40 produced thereto are prepared.

Figure 6B:
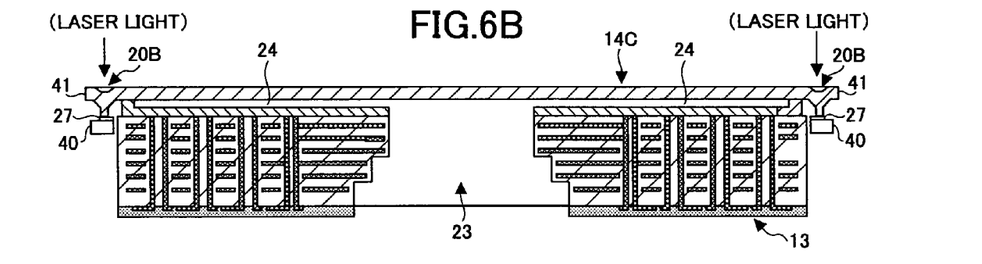
Figure 6C:
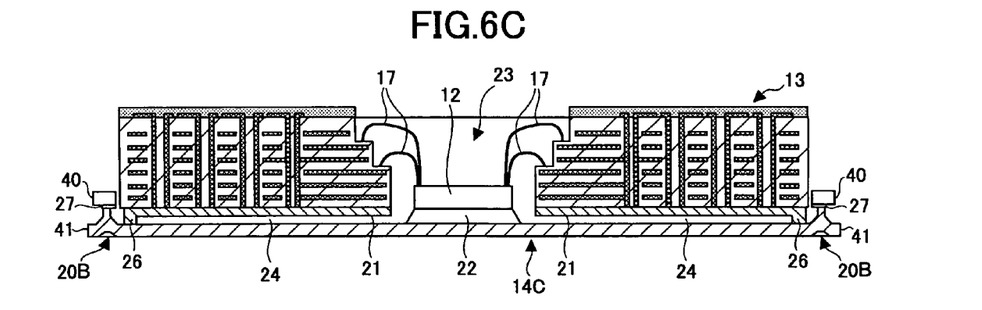

Positioning is carried out between the circuit substrate 13 and the heat radiating plate 14C as shown in FIG. 6A in such a manner that the projections 29 produced on the heat radiating part 14C may face the dummy substrate parts 40 produced at the peripheral portions of the circuit substrate 13. Next, the heat radiating plate 14C is mounted on the circuit substrate 13 in such a manner that the projections 29 may come in contact with the metal layers 27 provided on the dummy substrate parts 40. After that, as shown in FIG. 6B. laser light is applied to the temporary fixing parts 20B, and thereby, the projections 29 are soldered onto the metal layers 27 by a laser soldering process. Thereby, the heat radiating plate 14C is temporarily fixed onto the circuit substrate 13 (temporary fixing process).

Further, as in the embodiment described with reference to FIGS. 3A through 3D, a gap portion 24 is produced between the circuit substrate 13 and the heat radiating plate 14C, since the projections 29 are soldered onto the circuit substrate 13 (metal layers 27) by the laser soldering process. Further, also as in the embodiment described with reference to FIGS. 3A through 3D, a first dam part 26 is produced in a periphery of the insulating material 21. After the heat radiating plate 14C is temporarily fixed on the dummy substrate parts 40 as mentioned above, an element mounting process of mounting a semiconductor element 12 is carried out after the circuit substrate 13 is inverted upside down.

Figure 6D:
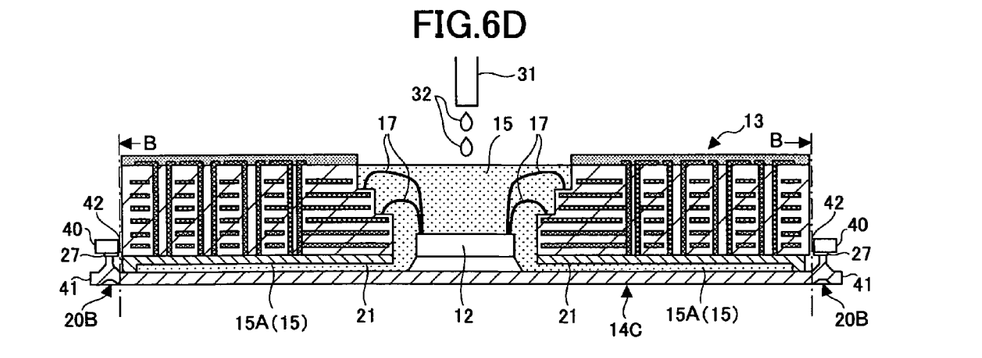

After the element mounting process is completed, a sealing resin inserting process is carried out. In this sealing resin inserting process, as shown in FIG. 6D, a resin 32 is potted in a cavity 23 with the use of a dispenser 31. At this time, the resin 32 thus potted runs also through the gap portion 24 as mentioned above. Further, the resin 32 thus having flown to the peripheral position of the circuit substrate 13 is blocked by the first dam part 26 so that the resin 32 is prevented from further flowing. Thereby, the resin 32 is prevented from flowing externally from the circuit substrate 13.

Thus, also in the third embodiment, the outside of the circuit substrate 13 is prevented from being contaminated by the resin 32 otherwise having flown externally. Thus, it is possible to improve the reliability of the semiconductor device 10C thus manufactured. Also, a process otherwise required to remove the resin 32 having flown externally is not required. Thus, it is possible to simplify the manufacture process.

After the potting of the resin 32 is completed, heating processing (for example, 150° C.) is carried out, whereby the resin 32 is hardened, and as a result, a sealing resin 15 and a bonding resin 15A are produced. Further, as a result of the resin being hardened and thus the bonding resin being produced, the heat radiating plate 14C is permanently fixed to the circuit substrate by adhesive power of the bonding resin 15A.

In this heating processing, by the same reason as that mentioned above, neither internal stress nor voids are generated in the sealing resin 15 or in the bonding resin 15A. Thus, it is possible to improve the reliability of the semiconductor device 10C thus manufactured. Further, also in the third embodiment, it is possible to omit the adhesive sheet 8 (see FIG. 1) and a process of applying the adhesive sheet 8 to fix between the circuit substrate 3 and the heat radiating plate 4, which would be required in the related art. Thus, it is possible to simplify the manufacture process and to reduce the cost.

After the above-mentioned sealing resin inserting process is finished, a process of removing the dummy substrate parts 40 is carried out if necessary. Specifically, at positions indicated by alternate long and short dash lines B shown in FIG. 5 or 6D (referred to as removing positions B, hereinafter), the dummy substrate parts 40 of the heat radiating plate 14C and portions of the heat radiating plate 14C facing the dummy substrate parts 40 are removed.

In the third embodiment, the slits 42 are produced between the dummy substrate parts 40 and a body part of the circuit substrate 13. These slits 42 are produced at positions agreeing with the removing positions B. Since the mechanical strengths at portions at which the slits 42 are provided are reduced accordingly in comparison to the other portions, removal of the dummy substrate part 40 can be easily achieved as a result of the removing processing being carried out at the slits 42. As a result of the removing processing being carried out, the dummy substrate parts 40 and the portions of the heat radiating plate 14C facing the dummy substrate parts 40 are removed. As a result, the semiconductor device 10C is separated therefrom.

The dummy substrata parts 40 may function as portions with which the semiconductor device 10C is handled, or may have a function of protecting the circuit substrate 13, i.e., the body part itself. Accordingly, actual timing of the removing processing may be appropriately selected in consideration of the manufacturing process or a shipping process of the semiconductor device 10C.

The present application is based on Japanese Priority Application No. 2004-377039 filed on Dec. 27, 2004, the entire contents of which are hereby incorporated herein by reference.

What is claimed is:

1. A semiconductor device, comprising:
   a semiconductor element;
   a circuit substrate having a cavity at a center thereof;
   a heat radiating member having said semiconductor element bonded at a central portion thereof; and
   a resin configured to seal said semiconductor element in said cavity, wherein:
   said resin is disposed continuously from said cavity to the inside of a gap portion which communicates with said cavity and is formed between said circuit substrate and said heat radiating member, and by means of adhesive power of said resin, said heat radiating member is permanently fixed to said circuit substrate.

2. The semiconductor device as claimed in claim 1, wherein:
   an insulating material is disposed on a surface of said circuit substrate, said surface faces said heat radiating member, and also, a dam part is produced on said insulating material at a peripheral portion of said gap portion for avoiding a flow of said bonding resin.

3. The semiconductor device as claimed in claim 1, wherein:
a dam part is produced on said heat radiating member at a peripheral portion of said gap portion for avoiding a flow of said resin.

4. The semiconductor device as claimed in claim 1, wherein:
a temporary fixing part is provided for temporarily fixing said heat radiating member to said circuit substrate.

5. The semiconductor device as claimed in claim 4, wherein:
a recess portion is produced at a position at which said temporary fixing part is provided.

6. The semiconductor device as claimed in claim 1, wherein:
said circuit substrate has a dummy substrate part in a periphery thereof; and
a temporary fixing part is provided with which said heat radiating member is temporarily fixed to said dummy substrate.

7. The semiconductor device as claimed in claim 1, wherein:
a recess portion is produced in said heat radiating member at a position at which said temporary fixing part is provided.

* * * * *